(12) United States Patent
Pigott et al.

(10) Patent No.: US 8,970,285 B2
(45) Date of Patent: Mar. 3, 2015

(54) DUAL SUPPLY LEVEL SHIFTER CIRCUITS

(71) Applicants: John M. Pigott, Phoenix, AZ (US); Ira G. Miller, Tempe, AZ (US); Paul E. Fletcher, Phoenix, AZ (US)

(72) Inventors: John M. Pigott, Phoenix, AZ (US); Ira G. Miller, Tempe, AZ (US); Paul E. Fletcher, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/831,828

(22) Filed: Mar. 15, 2013

(65) Prior Publication Data

US 2014/0266385 A1 Sep. 18, 2014

(51) Int. Cl.
*H03L 5/00* (2006.01)
(52) U.S. Cl.
CPC ........................................ *H03L 5/00* (2013.01)
USPC ................................ 327/333; 326/62; 326/81
(58) Field of Classification Search
USPC .................... 326/62–63, 80–82; 327/306, 333
See application file for complete search history.

(56) References Cited

U.S. PATENT DOCUMENTS

| | | | |
|---|---|---|---|
| 5,565,806 A * | 10/1996 | Cordini et al. | 327/108 |
| 6,002,290 A | 12/1999 | Avery et al. | |
| 6,774,704 B2 * | 8/2004 | Kushnarenko | 327/530 |
| 7,288,964 B2 * | 10/2007 | Ku et al. | 326/81 |
| 8,638,121 B2 * | 1/2014 | Suzuki et al. | 326/81 |

\* cited by examiner

*Primary Examiner* — Dinh Le
(74) *Attorney, Agent, or Firm* — The Mason Group Patent Specialists LLC; Valerie M. Davis (57) ABSTRACT

A dual supply level shifter circuit includes a switching circuit and a set of level shifter circuits coupled to the switching circuit. The switching circuit includes a first set of coupled transistors, wherein the supply switching circuit is coupled to a first supply source that is configured to provide a first power supply voltage and is coupled to a second supply source that is configured to provide a second power supply voltage. The set of level shifter circuits includes a second set of coupled transistors, wherein the set of level shifter circuits is configured to receive a voltage input signal at an input node from a first circuit and to supply to an output node of the dual supply level shifter circuit an output signal having a value that is a highest voltage value between the first power supply voltage and the second power supply voltage.

20 Claims, 7 Drawing Sheets

DUAL SUPPLY LEVEL SHIFTER CIRCUITS

FIELD

The present disclosure relates generally to integrated circuits and more particularly to a level shifter circuit disposed on a complementary metal-oxide semiconductor integrated circuit that utilizes two different power supply voltages.

BACKGROUND

Some complementary metal-oxide semiconductor (CMOS) integrated circuits (ICs) contain power supply voltage domains that operate at different power supply voltage levels or values, wherein the power supply voltage level represents logic '1' digital information to the corresponding domain. For instance, in a domain B, logic '1' and logic '0' may be represented by a 1.5 volt (V) power supply voltage level and 0 V, respectively; whereas, in a domain C, logic '1' and logic '0' may be represented by a 2.77 V power supply voltage level and 0 V, respectively.

From the design side, domains that operate at different power supply voltage levels create a unique challenge. For example, if there is a signal that goes from domain B to domain C, an active high value on that signal associated with a voltage of 1.5 V may be interpreted as a logic '0' in domain C, assuming the threshold voltage in domain C is greater than 1.5 V. Similarly, a signal going from domain C to domain B, which has a logic value of '0' but a voltage level of 1.5 Volts, may be interpreted as logic '1' in domain B. Inserting a level shifter circuit, also referred to herein as a level shifter, between the two domains can solve this problem.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

The present disclosure is illustrated by way of example and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

A level shifter circuit receives from one domain an input signal having one voltage level and "translates" that input voltage level to a higher voltage level, for instance to a higher power supply voltage level, such that the logical value of that signal remains the same in both domains. In such a case, the translation function is enabled by a connection of the level shifter circuit to the higher power supply voltage level. However, a problem arises when the higher power supply voltage is diminished or is absent or turned off, for example to save power, as would occur in some applications such as a shut down condition in a power management system. In a conventional level shifter circuit, when for instance the higher power supply voltage goes away, the level shifter circuit fails to properly operate. More particularly, neither a representation of logic '1' or logic '0' is supplied at an output node of the level shifter circuit, thereby creating in essence a "floating node" at the output of the level shifter circuit. This floating node interrupts the digital information or signal flow to the circuits connected to the level shifter circuit, thereby impeding the proper operation of these circuits.

In accordance with an embodiment is a dual supply level shifter circuit comprising a supply switching circuit and a set of level shifter circuits coupled to the supply switching circuit. The term supply switching circuit is also referred to herein interchangeably with the terms switching circuit and power supply switching circuit. The supply switching circuit includes a first set of coupled transistors, wherein the supply switching circuit is coupled to a first supply source that is configured to provide a first power supply voltage and is coupled to a second supply source that is configured to provide a second power supply voltage. The set of level shifter circuits includes a second set of coupled transistors, wherein the set of level shifter circuits is configured to receive a voltage input signal at an input node from a first circuit and to supply to an output node of the dual supply level shifter circuit an output signal having a value that is a highest voltage value between the first power supply voltage and the second power supply voltage. In each described embodiment, the set of level shifter circuits comprises a set of complementary metal-oxide semiconductor (CMOS) transistors, also referred to herein as metal-oxide field effect transistors (MOSFETs). A gate terminal of a MOSFET is referred to as a control terminal, and the source and drain terminals of a MOSFET are referred to as current terminals. Thus, where the "terminal" of a MOSFET is referenced, it is implied that the terminal is a current terminal.

In a particular embodiment, the set of level shifter circuits has only a single level shifter circuit. In another embodiment, the set of level shifter circuits comprises a first level shifter circuit and a second level shifter circuit. In this latter embodiment, the first level shifter circuit includes an output node 330, and the second level shifter circuit includes an output node that is connected to the output node 328 of the dual supply dual supply level shifter circuit, wherein the output node of the first level shifter circuit is coupled to the output node of the second level shifter circuit via a first transistor 322. The first transistor has a gate terminal coupled to the second supply source.

In addition, the dual supply level shifter circuit includes an inverted output node 324 of the output node 328 of the dual supply level shifter circuit. The first level shifter circuit includes an inverted output node 326 of the output node 330 of the first level shifter circuit. The second level shifter circuit includes an inverted output node of the output node of the second level shifter circuit. The inverted output node of the second level shifter circuit is connected to the inverted output node 324 of the dual supply level shifter circuit; and the inverted output node of the second level shifter circuit is coupled to the inverted output node 326 of the first level shifter circuit via a second transistor 316. Moreover, in the embodiment having the first and second level shifting circuits, the supply switching circuit comprises a transistor 314 that couples the second level shifter circuit to the second supply source, wherein the transistor includes a gate terminal coupled to the first supply source.

An illustrative benefit of this dual supply level shifter circuit arrangement is that the circuit avoids the floating node inherent in prior art level shifter circuits. This is because the present dual supply level shifter circuit continues to operate even in the absence of an upper power supply voltage, also referred to herein as the second power supply voltage, while consuming substantially no quiescent or DC current. An additional illustrative benefit of the present dual supply level shifter circuit is that a single such circuit can power domains that operate at different power supply voltage levels instead of having to use separate prior art level shifter circuits for the different domains, thereby saving costs and valuable space on an IC.

Figure 1:
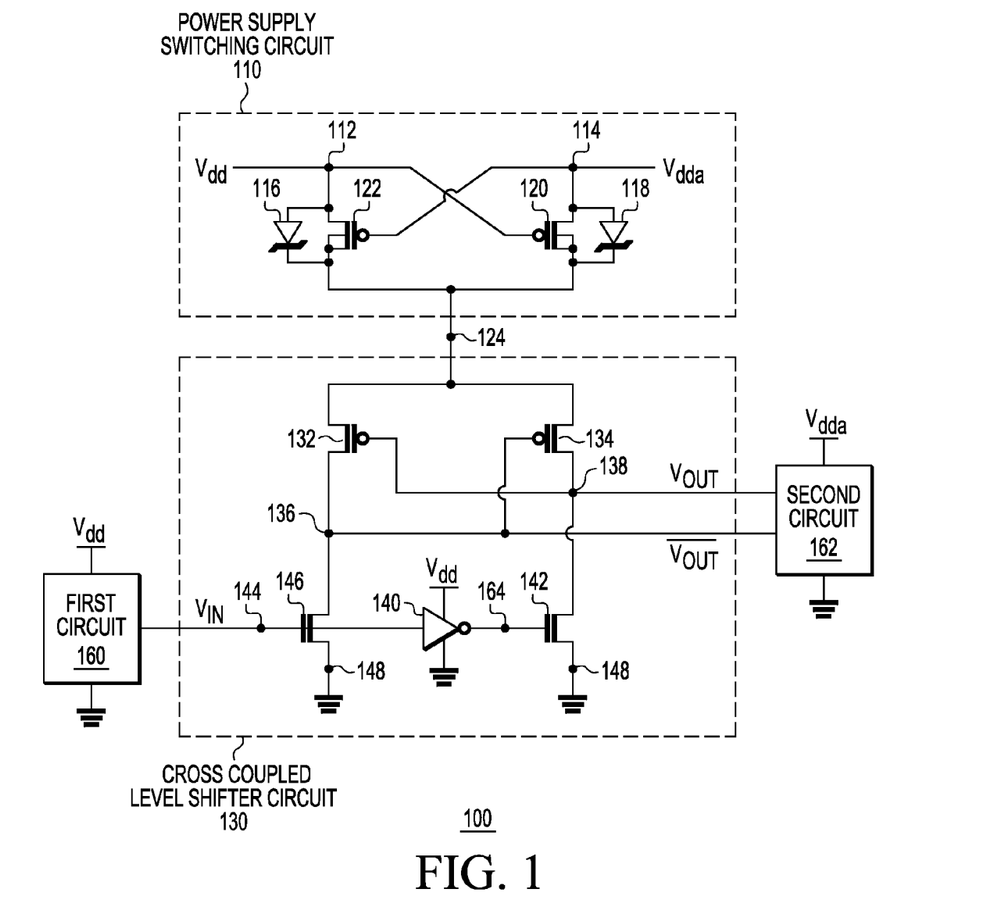
FIG. 1 illustrates an embodiment of a dual supply level shifter circuit utilizing a first power supply voltage Vdd and a second power supply voltage Vdda.
Figure 4:
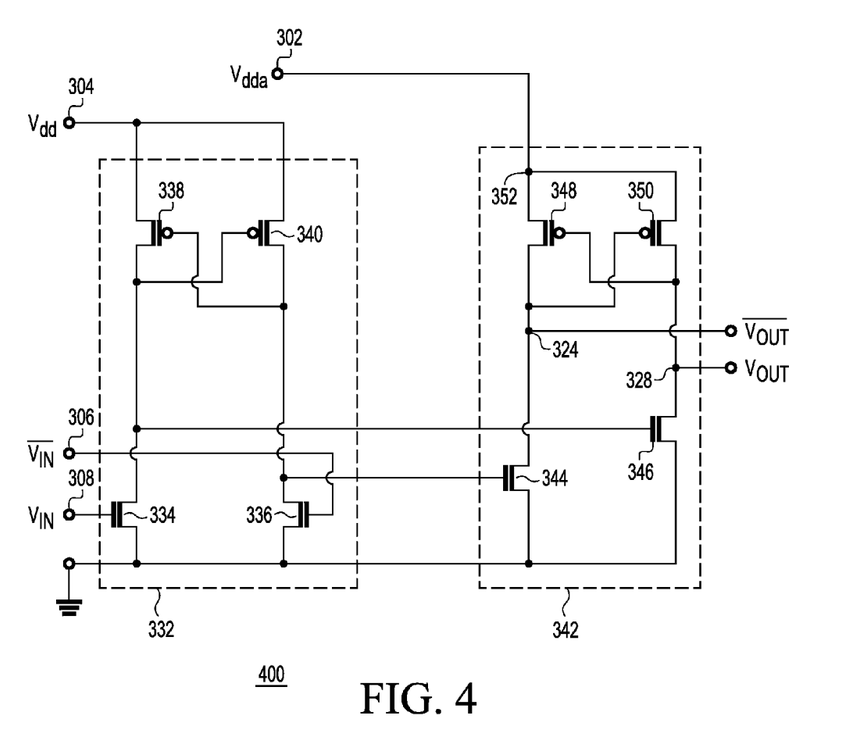
FIG. 4 illustrates the configuration of the dual supply level shifter circuit of FIG. 3 when the Vdda is present and is greater Vdd.
Figure 5:
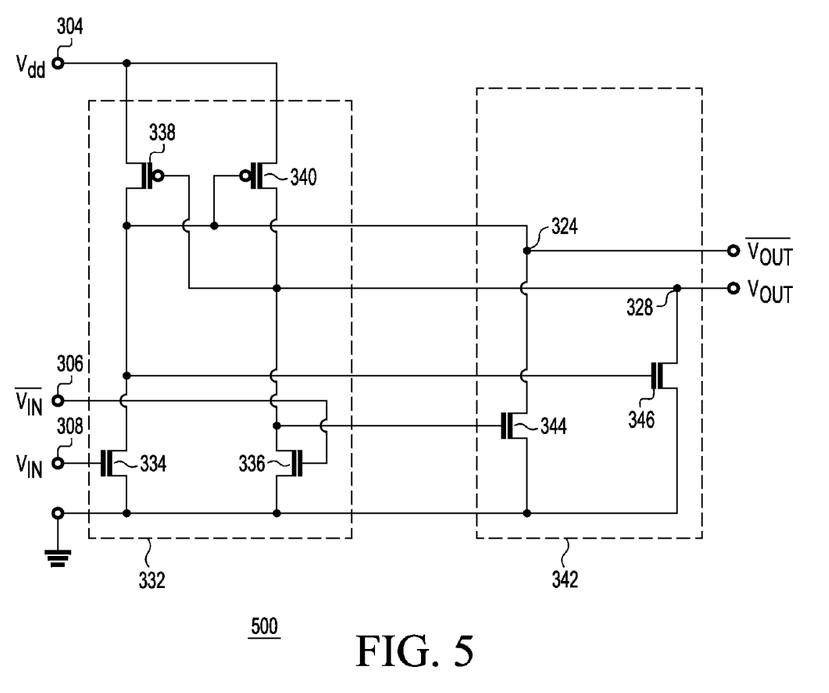
FIG. 5 illustrates the configuration of the dual supply level shifter circuit of FIG. 3 when Vdda is less than Vdd or is absent.

FIG. 1 is a circuit diagram illustrating a dual supply level shifter circuit 100 in accordance with an embodiment of the present disclosure. The dual supply level shifter circuit 100 receives an input signal $V_{IN}$ from a first circuit 160 at an input node 144 and translates $V_{IN}$ to an output signal $V_{OUT}$ at an output node 138. $V_{OUT}$ is provided to a second circuit 162. The first circuit 160 operates in a first voltage domain, e.g., Vdd; and the second circuit 162 operates in a second voltage domain, e.g., Vdda. Dual supply level shifter circuit 100 comprises a power supply switching circuit 110 comprising a first set of coupled transistors 120 and 122. The switching circuit 110 is coupled at a node 112 to a first supply source (not shown) that is configured to provide a first lower power supply voltage Vdd and is coupled at a node 114 to a second supply source (not shown) that is configured to provide a second upper power supply voltage Vdda. The phrases supply source, power supply, and power supply source are used interchangeably herein. In an embodiment, Vdd is 1.5 V, and Vdda is 2.77 V. However, the particular voltage levels of Vdd and Vdda depend, at least in part, on the application for the IC containing the dual supply level shifter circuit 100. The dual supply level shifter circuit 100 further comprises a set of level shifter circuits 130 that comprises a second set of coupled transistors 132, 134, 142, and 146. As used herein, set means one or more, for instance a set of one or more level shifter circuits or a set of one or more input or output signals. In this embodiment, the set of level shifter circuits 130 has only a single level shifter circuit comprised of all of the transistors 132, 134, 142, and 146 in the second set of coupled transistors. However, in the embodiment described below by reference to FIGS. 3-5, the set of level shifter circuits includes two level shifter circuits.

More particularly, the second set of coupled transistors comprises a first transistor 132, a second transistor 134, a third transistor 146, and a fourth transistor 142. In an embodiment, the first and second transistors 132 and 134 are p-channel metal-oxide semiconductor (PMOS) transistors, and the third and fourth transistors 146 and 142 are n-channel metal-oxide semiconductor (NMOS) transistors. However, a complementary embodiment can be envisioned wherein, for instance, the first and second transistors are NMOS transistors, and the third and fourth transistors are PMOS transistors and where the supply levels are negative with respect to the ground level. Those skilled in the art can use the teachings herein to design such complementary circuits for other illustrated embodiments. The terms PMOS and PMOS transistor are used herein interchangeably, and the terms NMOS and NMOS transistor are used herein interchangeably.

The first transistor 132 has: a gate terminal coupled to an output node 138; a first terminal, which is the source terminal of the PMOS, coupled to a node 124; and a second terminal, which is the drain terminal of the PMOS, coupled to a node 136.

The second transistor 134 has: a gate terminal coupled at the node 136 to the second terminal of the first transistor 132; a first terminal, which is the source terminal of the PMOS, coupled to the node 124; and a second terminal, which is the drain terminal of the PMOS, coupled to the output node 138. Because the gates of the transistors 132 and 134 are cross-coupled to the respective drains of those transistors, the level shifter circuit 130, and similarly coupled level shifters described herein, are referred to as cross-coupled level shifter circuits.

The third transistor 146 has: a gate terminal coupled to the first circuit 160 at the input node 144; a first terminal, which is the source terminal of the NMOS, coupled to a third supply source at a node 148; and a second terminal, which is the drain terminal of the NMOS, coupled to the second terminal of the first transistor 132 at the node 136. In an embodiment, the third supply source provides a lower voltage than both Vdd and Vdda. In a particular embodiment, the third supply source provides 0 V, referred to herein as ground. The fourth transistor 142 has: a gate terminal coupled to the first circuit 160 at the input node 144; a first terminal, which is the source terminal of the NMOS, coupled to the third supply source at the node 148; and a second terminal, which is the drain terminal of the NMOS, coupled to the output node 138.

In an embodiment, the gate terminal of the fourth transistor 142 is coupled at a node 164 to the first circuit 160 by way of an inverter 140 that is biased using Vdd. For example, the first circuit 160 is another circuit on the same IC as circuit 100, which provides the input voltage $V_{IN}$, at the node 144, which is translated into the output voltage $V_{OUT}$ at the node 138. In a further embodiment, an inverse of $V_{OUT}$, shown as $V_{OUT}$ bar, is provided to one or more other circuits on the IC, such as the second circuit 162, at an inverted output node 136 to the output node 138. An inverted output node provides, to the second circuit 162, a signal $V_{OUT}$ bar this is an inverted signal to $V_{OUT}$. By way of illustration, $V_{IN}$ switches between a value of 1.5 V and ground but can switch between ground and any voltage that substantially exceeds the threshold voltage of the NMOS transistor 146.

Further describing the dual supply level shifter circuit 100, the first set of coupled transistors of the power supply switching circuit 110 comprises a fifth transistor 122 and a sixth transistor 120. In this embodiment, transistors 120 and 122 are cross-coupled PMOS transistors, wherein the gates of the transistors are cross-coupled to the respective drains of the transistors. More particularly, the fifth transistor 122 has: a first terminal, which is the drain terminal of the PMOS, coupled to the first supply source at the node 112; a second terminal, which is the source terminal of the PMOS and a third terminal which is a body connection also called a bulk connection, coupled to the node 124; and a gate terminal coupled to second supply source at the node 114. The sixth transistor 120 has: a first terminal, which is the drain terminal of the PMOS, coupled to the second supply source at the node 114; a second terminal, which is the source terminal of the PMOS and a third terminal which is a body connection, coupled to the node 124; and a gate terminal coupled to the first supply source at the node 112.

The dual supply level shifter circuit 100 further comprises a first diode 116 and a second diode 118. The first diode 116 has an anode coupled to the first, drain, terminal of the fifth transistor 122 and a cathode coupled to the second, source, terminal and the third terminal of the fifth transistor 122. The second diode 118 has an anode coupled to the first, drain, terminal of the sixth transistor 120 and a cathode coupled to the second, source, terminal and the third terminal of the sixth transistor 120. In an embodiment, the first and second diodes 116 and 118 are Schottky diodes, but can be other types of diodes such as standard pn diodes or the equivalent.

The diode 116 allows power to be supplied to node 124 even when the difference between the two input supplies is too small to fully turn on transistor 122. Similarly diode 118 performs this function for transistor 120. More particularly, when Vdd and Vdda are approximately equal, $V_{OUT}$ will not reach the Vdd or Vdda level, but will reach within a diode drop, about 0.3 V for a Schottky, of this level. This "softness" is generally not critical since Vdda is usually either high at Vdda or 0V, not "in the middle". This behavior is shown in a region 240 of FIG. 2 below. In a further embodiment, diodes 116 and 118 are absent from the circuit 100. This embodiment is suitable when it is anticipated that there will be no time during circuit 100 operation that Vdd and Vdda are approximately equal.

In general, as arranged, the dual supply level shifter circuit 100 is configured to receive a set of voltage input logic signals also referred to herein as input signals, which in this case includes $V_{IN}$ and the inverse of or an inverted signal of $V_{IN}$, from the first circuit 160. Circuit 100 is further configured to supply to the output node 138—when generating a logic '1' level—a highest voltage value between the first power supply voltage Vdd and the second power supply voltage Vdda, which is passed by the switching circuit 110 to the node 124. A signal $V_{OUT}$ is supplied at the output node 138, and in the illustrative implementation shown in FIG. 1 $V_{OUT}$ bar, which is the inverse of $V_{OUT}$, is supplied at the node 136.

Under one example mode of operation, Vdda is higher than Vdd, for instance by at least the threshold voltage of transistor 120. In this mode of operation, the PMOS transistor 122 is off, but the PMOS transistor 120 is turned on and supplies the power supply voltage Vdda to the node 124. With Vdda at the node 124, and $V_{IN}$ high, transistor 146 is turned on, which pulls node 136 low and turns on transistor 134, which passes Vdda to the output node 138. Moreover, transistors 132 and 142 are off. When $V_{IN}$ goes low, transistor 146 is turned off and transistor 142 is turned on, which pulls the output node 138 low and turns on the transistor 132, which passes Vdda to the node 136. The transistor 134 is turned off. Thus, as $V_{IN}$ switches between 1.5 V and 0 V while Vdda is present, circuit 100 is configured to supply Vdda at either node 138 or 136, respectively, to control downstream circuit blocks.

Conversely, if Vdda falls below Vdd, circuit 100 operates to supply Vdd at either node 138 or 136 as $V_{IN}$ switches between 1.5 V and 0 V, respectively. More particularly, the PMOS transistor 120 is off, but the PMOS transistor 122 is turned on and supplies the power supply voltage Vdd to the node 124. With Vdd at the node 124, and $V_{IN}$ high, transistor 146 is turned on, which pulls node 136 low and turns on transistor 134, which passes Vdd to the output node 138. Moreover, transistors 132 and 142 are off. When $V_{IN}$ goes low, transistor 146 is turned off and transistor 142 is turned on, which pulls the output node 138 low and turns on the transistor 132, which passes Vdd to the node 136. The transistor 134 is turned off. Accordingly, the input signal $V_{IN}$ is configured to have a first voltage range between a third power supply voltage 0V and the first power supply voltage Vdd, and the output signal $V_{OUT}$ is configured to have a second voltage range between the third power supply voltage 0V and the highest voltage value between the first power supply voltage Vdd and the second power supply voltage Vdda.

Figure 2:
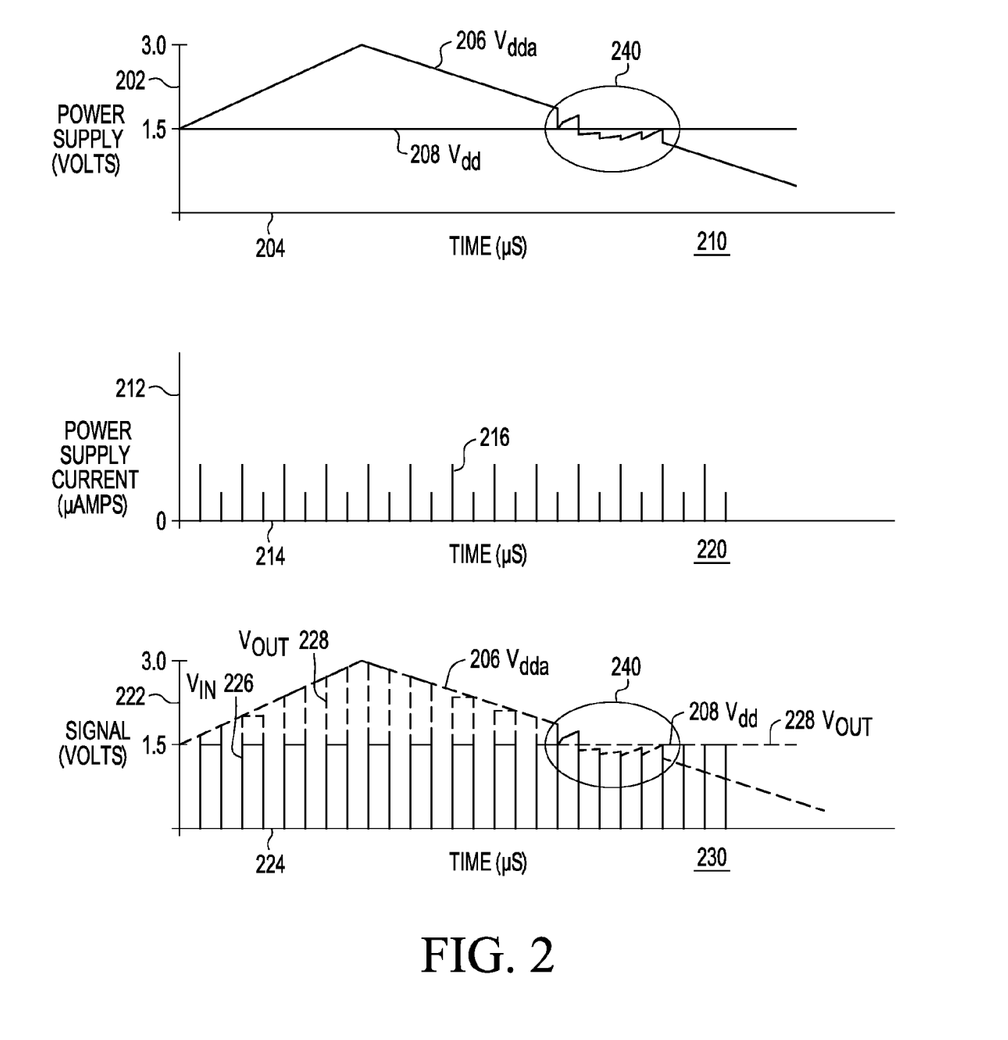
FIG. 2 plots the variation over time of an output voltage of the dual supply level shifter circuit shown in FIG. 1 when Vdda is greater than Vdd and when Vdda is less than Vdd.

FIG. 2 shows plots at 210, 220, and 230 for different voltage and current characteristics associated with the dual supply level shifter circuit 100 shown in FIG. 1 and previously described. Illustrated at 210 is: a plot 206 of the value of the normally upper power supply voltage Vdda in volts along an axis 202 versus time in microseconds (μs) along an axis 204; and a plot 208 of the value of the normally lower power supply voltage Vdd in volts along the axis 202 versus time along the axis 204. Illustrated at 220 is a plot 216 of the value of power supply current in microamperes (μA) along an axis 212 versus time in microseconds (μs) along an axis 214. Illustrated at 230 is: the plot 206; the plot 208; a plot 226 of the value of $V_{IN}$ in volts along an axis 222 versus time in μs along an axis 224; and a plot 228 of the value of $V_{OUT}$ at the node 138 in volts along the axis 222 versus time along the axis 224.

As can be seen from the plots shown at 210, 220, and 230, when Vdda is present, $V_{OUT}$ at the node 138 follows the higher of the two power supply voltages Vdd or Vdda. However, as explained above, when Vdda falls below Vdd, $V_{OUT}$ at the node 138 follows the power supply voltage Vdd. In this manner, continued circuit operation of the dual supply level shifter circuit 100 is maintained even if Vdda is turned off or fails. Moreover, the power supply current plot 216 shows that during operation of the dual supply level shifter circuit 100, only switching currents are drawn from the two power supplies voltages. There is no DC current drawn from or reverse DC current driven into the power supplies.

Figure 3:
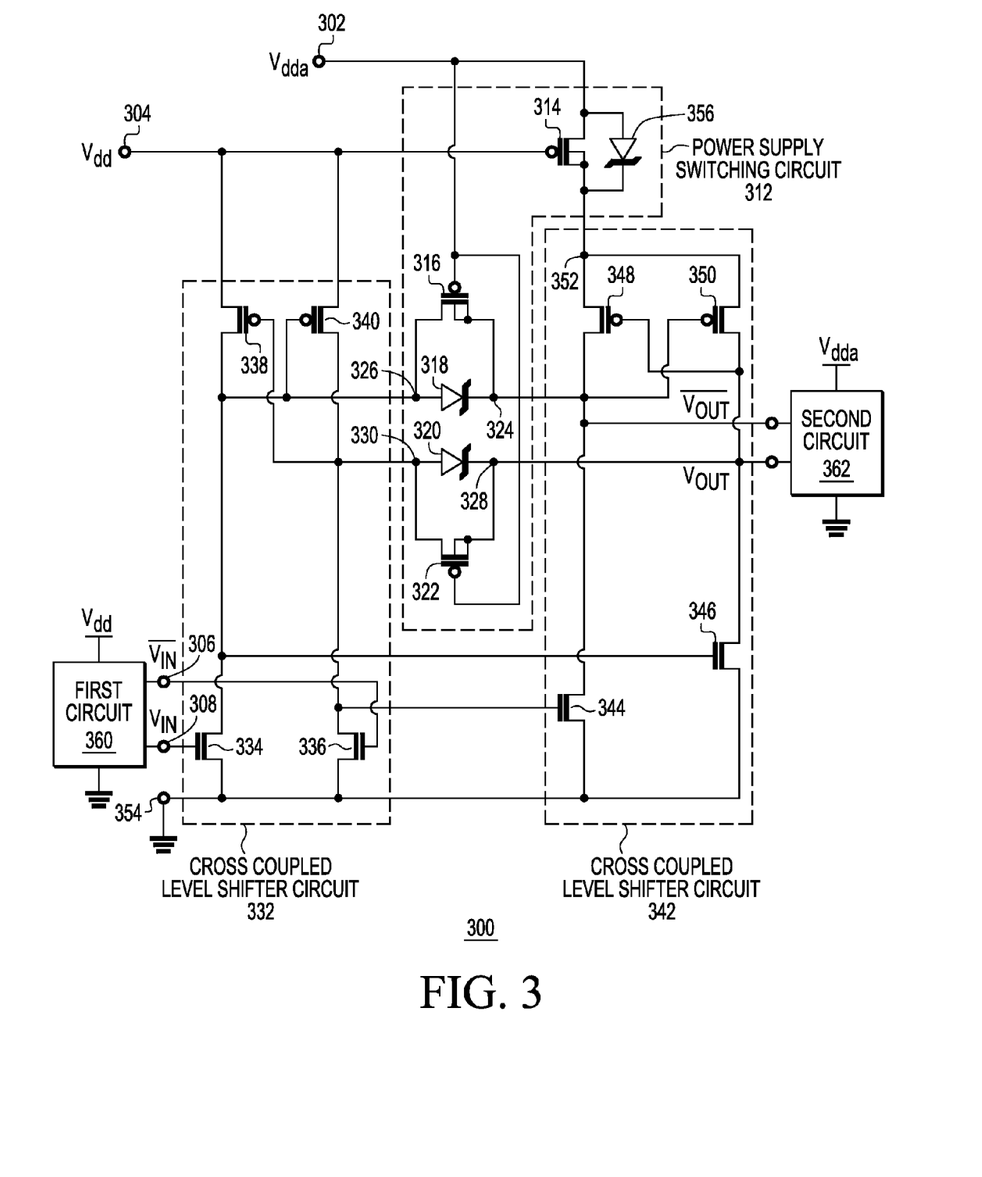
FIG. 3 illustrates another embodiment of a dual supply level shifter circuit utilizing Vdd and Vdda.

FIG. 3 is a circuit diagram illustrating a dual supply level shifter circuit 300 in accordance with another embodiment of the present disclosure. The dual supply level shifter circuit 300 receives an input signal $V_{IN}$ from a first circuit 360 at an input node 308 and translates $V_{IN}$ to an output signal $V_{OUT}$ at an output node 328. $V_{OUT}$ is provided to a second circuit 362. The first circuit 360 operates in a first voltage domain, e.g., Vdd; and the second circuit 362 operates in a second voltage domain, e.g., Vdda. Dual supply level shifter circuit 300 comprises a power supply switching circuit 312, comprising a first set of coupled transistors 314, 316 and 322. The switching circuit 312 is coupled at a node 304 to a first supply source (not shown) that is configured to provide a first lower power supply voltage Vdd and is coupled at a node 302 to a second supply source (not shown) that is configured to provide a second upper power supply voltage Vdda. In an embodiment, Vdd is 1.5 V, and Vdda is 2.77 V. The dual supply level shifter circuit 300 further comprises a set of level shifter circuits that comprises a second set of coupled transistors 334, 336, 338, 340, 344, 346, 348, and 350. In this embodiment, the set of level shifter circuits comprises a first level shifter circuit 332 comprising a first subset 334, 336, 338, and 340 of the second set of coupled transistors and a second level shifter circuit 342 comprising a second subset 344, 346, 348, and 350 of the second set of coupled transistors.

In general, The dual supply level shifter circuit 300 includes the supply switching circuit 312 comprising a first set of coupled transistors that includes a first transistor 322, wherein the supply switching circuit is coupled to a first supply source that is configured to provide a first power supply voltage Vdd and is coupled to a second supply source that is configured to provide a second power supply voltage Vdda. The circuit 300 further includes a set of level shifter circuits comprising a first level shifter circuit 332 coupled to the first supply source and a second level shifter circuit 342 coupled to the second supply source, wherein the set of level shifter circuits comprises a second set of coupled transistors. The set of level shifter circuits is configured, to receive a voltage input signal at an input node 308 from a first circuit 360 and to supply to an output node 328 of the dual supply level shifter circuit an output signal having a value that is a highest voltage value between the first power supply voltage and the second power supply voltage. The first level shifter circuit includes an output node 330, and the second level shifter circuit includes an output node that is connected to the output node 328 of the dual supply level shifter circuit, wherein the output node 330 of the first level shifter circuit is coupled to the output node of the second level shifter circuit via the first transistor 322. The supply switching circuit 312 further comprises a second transistor 314 that couples the second level shifter circuit to the second supply source, wherein the second transistor includes a gate terminal that is connected to the first supply source.

More particularly, the first subset of the second set of coupled transistors comprises a first transistor 338, a second transistor 340, a third transistor 334, and a fourth transistor 336. The second subset of the second set of coupled transistors comprises a fifth transistor 348, a sixth transistor 350, a seventh transistor 344, and an eighth transistor 346. In an embodiment the first, second, fifth and sixth transistors are p-channel metal-oxide semiconductor transistors; and the third, fourth, seventh and eighth transistors are n-channel metal-oxide semiconductor transistors. Moreover, in the illustrative embodiment described herein, transistors 334, 336, 338, and 340 are arranged as a cross-coupled level shifter circuit 332, which is configured and functions similarly to the level shifter circuit 130 of FIG. 1 described above. Transistors 344, 346, 348, and 350 are also arranged and configured as a cross-coupled level shifter circuit 342, which is configured and functions similarly to the level shifter circuit 130 of FIG. 1 described above.

More particularly, the first transistor 338 has: a gate terminal coupled to an output node 328 via a diode 320; a first terminal, which is the source terminal of the PMOS, coupled to the first supply source at the node 304; and a second terminal, which is the drain terminal of the PMOS, coupled to a node 326. The second transistor 340 has: a gate terminal coupled at the node 326 to the second terminal of the first transistor 338; a first terminal, which is the source terminal of the PMOS, coupled to the first supply source at the node 304; and a second terminal, which is the drain terminal of the PMOS, coupled to the output node 328 via the diode 320.

The third transistor 334 has: a gate terminal coupled to the first circuit 360 at the input node 308; a first terminal, which is the source terminal of the NMOS, coupled to a third supply source at a node 354; and a second terminal, which is the drain terminal of the NMOS, coupled to the second terminal of the first transistor 338 at the node 326. In an embodiment, the third supply source provides a lower voltage than both Vdd and Vdda, such as ground in one particular embodiment. The fourth transistor 336 has: a gate terminal coupled to the first circuit 360 at a node 306; a first terminal, which is the source terminal of the NMOS, coupled to the third supply source at the node 354; and a second terminal, which is the drain terminal of the NMOS, coupled to the output node 328 via the diode 320.

In an embodiment, the first circuit 360 is another circuit on the same IC as circuit 300, which provides the input voltage $V_{IN}$, at the node 308 and a voltage signal $V_{IN}$ bar at an inverted input node 306. $V_{IN}$ bar is an inverse signal of $V_{IN}$. In a further embodiment, $V_{IN}$ bar can be provided by an inverter (not shown), which is coupled between nodes 306 and 308. As described in detail below, the input voltage $V_{IN}$ is translated into an output voltage $V_{OUT}$ at the node 328. In addition, in the embodiment illustrated, an inverse of $V_{OUT}$, shown as $V_{OUT}$ bar, is provided at an inverted output node 324 to one or more other circuits on the IC, such as the second circuit 362. By way of illustration, $V_{IN}$ switches between a value of Vdd=1.5 V and 0 V.

The fifth transistor 348 has: a gate terminal coupled to the output node 328; a first terminal, which is the source terminal of the PMOS, coupled to the node 352 and coupled to the second supply source at the node 302 via the transistor 314; and a second terminal, which is the drain terminal of the PMOS, coupled to the node 324. The sixth transistor 350 has: a gate terminal coupled at the node 324 to the second terminal of the fifth transistor 348; a first terminal, which is the source terminal of the PMOS, coupled to the node 352 and coupled to the second supply source at the node 302 via the transistor 314; and a second terminal, which is the drain terminal of the PMOS, coupled to the output node 328.

The seventh transistor 344 has: a gate terminal coupled to a node to receive a signal that is equivalent to $V_{IN}$; a first terminal, which is the source terminal of the NMOS, coupled to the third supply source at the node 354; and a second terminal, which is the drain terminal of the NMOS, coupled to the second terminal of the fifth transistor 348 at the node 324. The eighth transistor 346 has: a gate terminal coupled to a node to receive a signal that is equivalent to $V_{IN}$ bar; a first terminal, which is the source terminal of the NMOS, coupled to the third supply source at the node 354; and a second terminal, which is the drain terminal of the NMOS, coupled to the output node 328. In the arrangement shown in FIG. 3, the gate terminal of the seventh transistor 344 is coupled to the second terminal of the fourth transistor 336 to receive the signal that is equivalent to $V_{IN}$. Similarly, the gate terminal of the eighth transistor 346 is coupled to the second terminal of the third transistor 334 to receive the signal that is equivalent to $V_{IN}$ bar. However, in an alternative arrangement, the gates of both transistors 344 and 346 are coupled to the first circuit 360 and receive $V_{IN}$ and $V_{IN}$ bar at the input node 308 and inverted input node 306, respectively.

Further describing the dual level shifter circuit 300, the first set of coupled transistors of the power supply switching circuit 312 comprises a ninth transistor 314, a tenth transistor 316 and an eleventh transistor 322. The ninth transistor 314 has: a gate terminal coupled to the first supply source at the node 304; a first, drain, terminal coupled to the second supply source at the node 302; and a second, source, terminal and third body connection terminal coupled to the node 352. The tenth transistor 316 has: a gate terminal coupled to the second supply source at the node 302; a first, drain, terminal coupled to the first level shifter circuit 332 at the node 326; and a second, source, terminal and third body connected terminal coupled to the second level shifter circuit 342 at the node 324. The eleventh transistor 322 has: a gate terminal coupled to the second supply source at the node 302; a first, drain, terminal coupled to the first level shifter circuit 332 at a node 330; and a second, source, terminal and third body connected terminal coupled to the second level shifter circuit 342 at the node 328. In an embodiment, all three transistors 314, 316, and 322 are PMOS transistors. However, other arrangements are possible within the scope of the present teachings.

The dual supply level shifter circuit 300 further comprises, a first diode 356, a second diode 318, and a third diode 320. The first diode 356 has an anode coupled at the node 302 to the first, drain, terminal of the ninth transistor 314 and a cathode coupled at the node 352 to the second, source, terminal and third terminal of the ninth transistor 314. The second diode 318 has an anode coupled at the node 326 to the first, drain, terminal of the tenth transistor 316 and a cathode coupled at the node 324 to the second, source, terminal and third terminal of the tenth transistor 316. The third diode 320 has an anode coupled at the node 330 to the first, drain, terminal of the eleventh transistor 322 and a cathode coupled at the node 328 to the second, source, terminal and third terminal of the eleventh transistor 322. The diodes 318, 320, and 356 prevent reverse current from flowing back up into both power supplies. In one embodiment, the first, second and third diodes 318, 320, and 356 are Schottky diodes but can be other types of diodes such as standard pn diodes or equivalent.

More particularly, when Vdd and Vdda are approximately equal, $V_{OUT}$ will not reach the Vdd or Vdda level, but will reach within a diode drop, about 0.3 V for a Schottky, of this level. This "softness" is generally not critical since Vdda is usually either high at Vdda or 0V, not "in the middle". This behavior is shown in a region 620 of FIG. 6 below. In another embodiment, diodes 318, 320, and 356 are not included in the circuit 300. This embodiment is suitable when it is anticipated that there will be no time during circuit 300 operation that Vdd and Vdda are approximately equal.

As described, the dual supply level shifter circuit 300 comprises two level shifter circuits 332 and 342 in parallel and coupled to different supply sources and to the switching circuit 312. Depending on whether Vdd or Vdda has the highest voltage value during a given time period, the switching circuit 312 selects either the level shifter circuit 332 or 342, respectively, to drive an output signal $V_{OUT}$ at the output node 328, and correspondingly an inverse of the output signal, $V_{OUT}$ bar, at the node 324. Accordingly, circuit 300 is configured to receive a set of voltage input signals, $V_{IN}$ and $V_{IN}$ bar, from the first circuit 360 and to supply to the output node 328 a highest voltage value between the first power supply voltage Vdd, which is passed to the output node by the level shifter circuit 332, and the second power supply voltage Vdda, which is passed to the output node by the level shifter circuit 342.

More particularly, during operation when Vdda is higher than Vdd, the PMOS transistors 316 and 322 are off, but the PMOS transistor 314 is turned on and supplies the power supply voltage Vdda to the node 352. Since transistors 316 and 322 are off, this disconnects the level shifter circuit 332 from the output nodes 324 and 328. Accordingly, the level shifter circuit 342 drives $V_{OUT}$ at the output node 328 and $V_{OUT}$ bar at the output node 324. The effective circuit is shown as a circuit 400 in FIG. 4. As can be seen, when Vdda is greater than Vdd, the level shifter circuit 332 functions to supply the set of input signals, $V_{IN}$ and $V_{IN}$ bar, to transistors 344 and 346, respectively. Accordingly, with Vdda provided to the node 352, the level shifter circuit 342 functions similarly to the level shifter circuit 130 described above to pass Vdda to the output node 328 or 324 depending on whether $V_{IN}$ is high or low, respectively.

Conversely, if Vdda falls below Vdd, circuit 300 operates to supply Vdd at either node 328 or 324 as $V_{IN}$ switches between 1.5 V and 0 V, respectively. More particularly, the PMOS transistors 316 and 322 are on, and the PMOS transistor 314 is turned off. The effective circuit is shown as a circuit 500 in FIG. 5. As can be seen, now the level shifter circuit 332 drives $V_{OUT}$ at the output node 328 and $V_{OUT}$ bar at the output node 324. More particularly with Vdd provided to the node 304, the level shifter circuit 332 functions similarly to the level shifter circuit 130 described above to pass Vdd to the output node 328 or 324 depending on whether $V_{IN}$ is high or low, respectively. Accordingly, the input signal $V_{IN}$ is configured to have a first voltage range between a third power supply voltage 0V and the first power supply voltage Vdd, and the output signal $V_{OUT}$ is configured to have a second voltage range between the third power supply voltage 0V and the highest voltage value between the first power supply voltage Vdd and the second power supply voltage Vdda.

Figure 6:
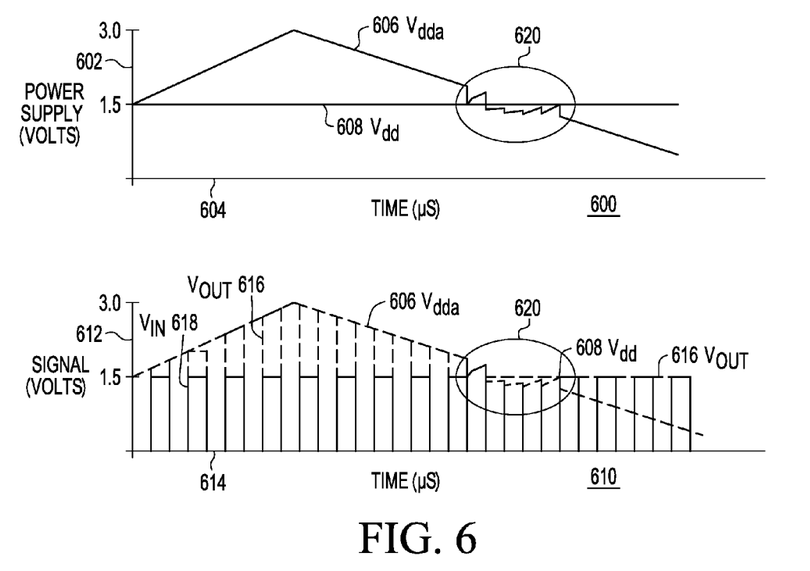
FIG. 6 plots the variation over time of an output voltage of the dual supply level shifter circuit shown in FIG. 3 when Vdda is greater than Vdd and when Vdda is less than Vdd.

FIG. 6 shows plots at 600 and 610 for different voltage and current characteristics associated with the dual supply level shifter circuit 300 shown in FIG. 3 and previously described. Illustrated at 600 is: a plot 606 of the value of the normally upper power supply voltage Vdda in volts along an axis 602 versus time in microseconds (µs) along an axis 604; and a plot 608 of the value of the normally lower power supply voltage Vdd in volts along the axis 602 versus time along the axis 604. Illustrated at 610 is: the plot 606; the plot 608; a plot 618 of the value of $V_{IN}$ in volts along an axis 612 versus time in uS along an axis 614; and a plot 616 of the value of $V_{OUT}$ at the node 328 in volts along the axis 612 versus time along the axis 614. As can be seen from the plots shown at 600 and 610, when Vdda is present, $V_{OUT}$ at the node 328 follows the higher of the two power supply voltages Vdd or Vdda. However, as explained above, when Vdda falls below Vdd, $V_{OUT}$ at the node 328 follows the power supply voltage Vdd. In this manner, continued circuit operation of the dual supply level shifter circuit 300 is maintained even if Vdda is turned off.

Figure 7:
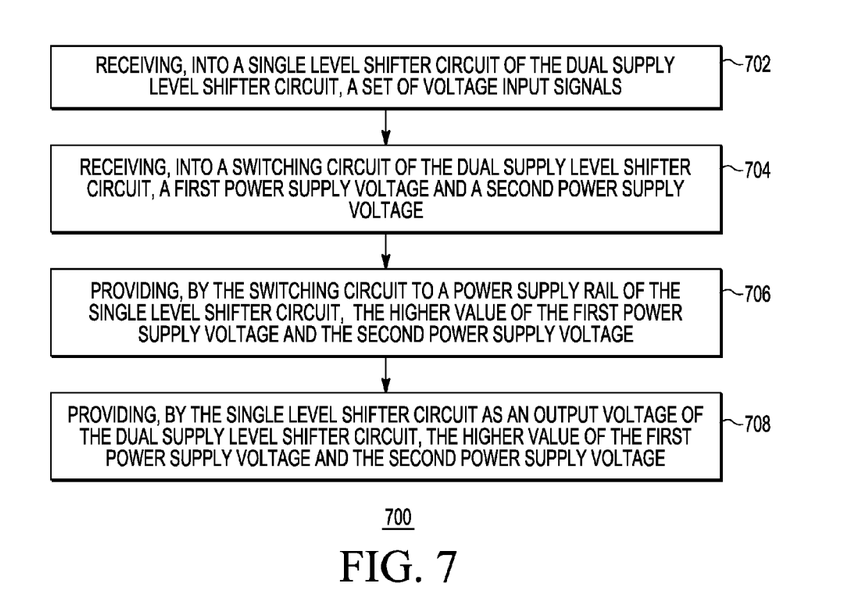
FIG. 7 illustrates a flow diagram of a method for generating an output from a dual supply level shifter circuit in accordance with one embodiment.

FIG. 7 illustrates a flow diagram of a method 700 for generating an output voltage from a dual supply level shifter circuit, such as the circuit 100, in accordance with an embodiment. The method includes: at 702 receiving, into a single level shifter circuit of the dual supply level shifter circuit, a set of voltage input signals, and at 704 receiving, into a switching circuit of the dual supply level shifter circuit, a first power supply voltage and a second power supply voltage. The method further includes at 706 providing, by the switching circuit to the single level shifter circuit, the higher value of the first power supply voltage and the second power supply voltage; and at 708 providing, by the single level shifter circuit as an output voltage of the dual supply level shifter circuit, the higher value of the first power supply voltage and the second power supply voltage.

Figure 8:
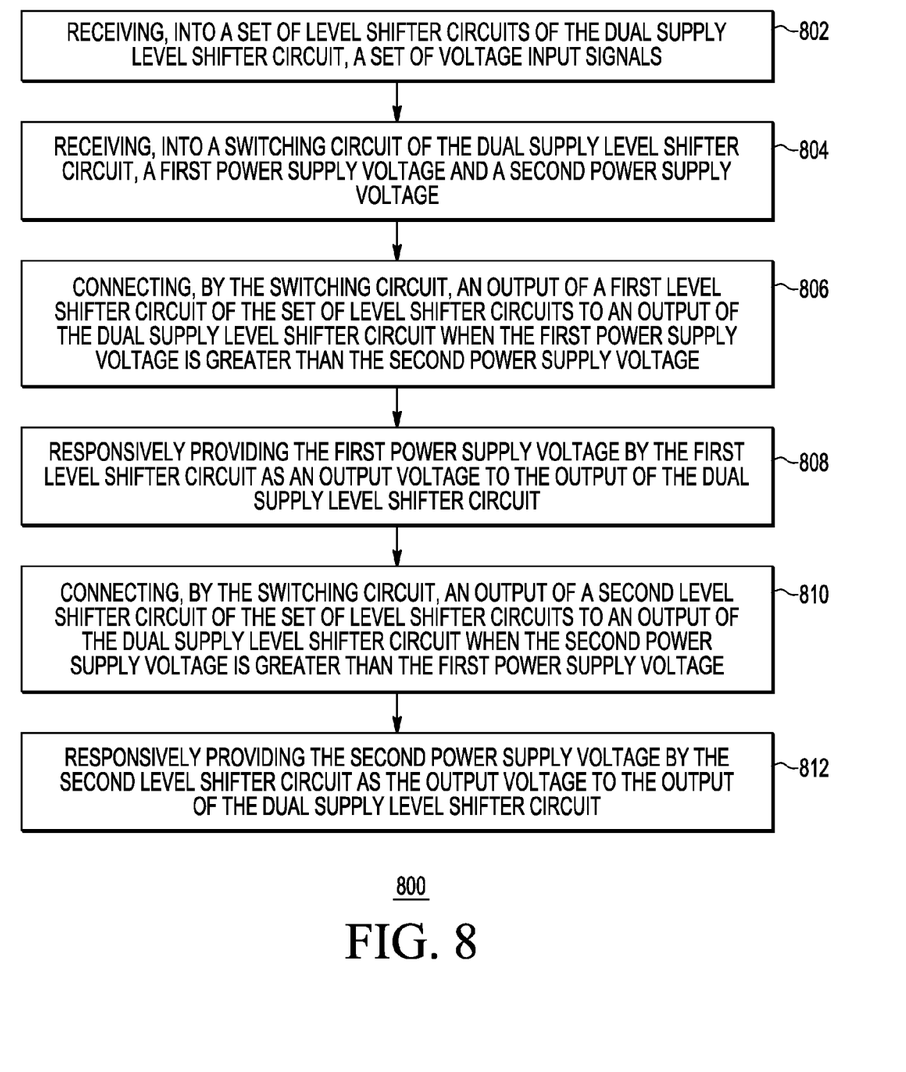
FIG. 8 illustrates a flow diagram of a method for generating an output from a dual supply level shifter circuit in accordance with another embodiment.

FIG. 8 illustrates a flow diagram of a method 800 for generating an output voltage from a dual supply level shifter circuit, such as the circuit 300, in accordance with an embodiment. The method includes at 802 receiving, into a set of level shifter circuits of the dual supply level shifter circuit, a set of voltage input signals; and at 804 receiving, into a switching circuit of the dual supply level shifter circuit, a first power supply voltage and a second power supply voltage. The method further includes at 806 connecting, by the switching circuit, an output of a first level shifter circuit of the set of level shifter circuits to an output of the dual supply level shifter circuit when the first power supply voltage is greater than the second power supply voltage. The first power supply voltage is responsively provided, at 808, by the first level shifter circuit as an output voltage to the output of the dual supply level shifter circuit. Moreover, the method includes at 810 connecting, by the switching circuit, an output of a second level shifter circuit of the set of level shifter circuits to the output of the dual supply level shifter circuit when the second power supply voltage is greater than the first power supply voltage. The second power supply voltage is responsively provided, at 812, by the second level shifter circuit as the output voltage to the output of the dual supply level shifter circuit.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to semiconductor fabrication including those using conventional CMOS technology, CMOS devices, MOSFETs, level shifter circuits, and other functional aspects of a system or IC, and the individual system or IC operating components, may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment. Moreover, the various IC embodiments described above may be produced or fabricated using conventional semiconductor processing techniques, e.g., well known CMOS techniques. Further, a variety of well-known and common semiconductor materials may be used, e.g., traditional metals such as aluminum, copper, gold, etc., polysilicon, silicon dioxide, silicon nitride, silicon, and the like.

In this document, the terms "comprises," "comprising," "has", "having", "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of" and any like or similar terms means that referenced circuit elements have an internal physical arrangement such as by virtue of a particular transistor technology used and/or physical coupling and/or connectivity with other circuit elements in an inactive state. This physical arrangement and/or physical coupling and/or connectivity while in the inactive state enables the circuit elements to perform stated functionality while in the active state of receiving and processing various signals at inputs of the circuit elements to generate signals at the output of the circuit elements. A device or structure that is "configured" in a certain way is configured in at least that way, but may also be configured in ways that are not described.

As further used herein, a "node" means any internal or external reference point, connection point, junction, signal line, conductive element, or the like, at which a given signal, logic level, voltage, data pattern, current, or quantity is present. Furthermore, two or more nodes may be realized by one physical element, and two or more signals can be multiplexed, modulated, or otherwise distinguished even though received or output at a common node.

The above description refers to nodes or features being "connected" or "coupled" together. As used here and, unless expressly stated otherwise, "coupled" means that one node or feature is directly or indirectly joined to or is in direct or indirect communication with another node or feature, and not necessarily physically. As used herein, unless expressly stated otherwise, "connected" means that one node or feature is directly joined to or is in direct communication with another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment, assuming that the functionality of the given circuit is not adversely affected.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A dual supply level shifter circuit comprising:
   a supply switching circuit comprising a first set of coupled transistors, wherein the supply switching circuit is coupled to a first supply source that is configured to provide a first power supply voltage and is coupled to a second supply source that is configured to provide a second power supply voltage;
   a set of level shifter circuits coupled to the supply switching circuit, wherein the set of level shifter circuits comprises a first set of coupled transistors and a second set of coupled transistors, coupled to receive output signals of the first set of coupled transistors wherein the set of level shifter circuits is configured to receive a voltage input signal at an input node from a first circuit and to supply to an output node of the dual supply level shifter circuit an output signal having a value that is a highest voltage value between the first power supply voltage and the second power supply voltage, which is passed by the supply switching circuit to the set of level shifter circuits.

2. The dual supply level shifter circuit of claim 1, wherein the set of level shifter circuits comprises a set of complementary metal-oxide semiconductor transistors.

3. The dual supply level shifter circuit of claim 1, wherein the set of level shifter circuits has only a single level shifter circuit.

4. The dual supply level shifter circuit of claim 3, wherein the single level shifter circuit comprises:
- a first transistor having a gate terminal coupled to the output node, a first terminal coupled to a first node, and a second terminal;
- a second transistor having a gate terminal coupled to the second terminal of the first transistor, a first terminal coupled to the first node, and a second terminal coupled to the output node;
- a third transistor having a gate terminal coupled to the input node, a first terminal coupled to a third supply source, and a second terminal coupled to the second terminal of the first transistor; and
- a fourth transistor having a gate terminal coupled to the input node, a first terminal coupled to the third supply source, and a second terminal coupled to the output node.

5. The dual supply level shifter circuit of claim 4, wherein the supply switching circuit comprises:
- a fifth transistor having a first terminal coupled to the first supply source, second and third terminals coupled to the first node, and a gate terminal coupled to the second supply source; and
- a sixth transistor having a first terminal coupled to the second supply source, second and third terminals coupled to the first node, and a gate terminal coupled to the first supply source.

6. The dual supply level shifter circuit of claim 5 further comprising:
- a first diode having an anode coupled to the first terminal of the fifth transistor and a cathode coupled to the second and third terminals of the fifth transistor; and
- a second diode having an anode coupled to the first terminal of the sixth transistor and a cathode coupled to the second and third terminals of the sixth transistor.

7. The dual supply level shifter circuit of claim 1, wherein the input signal is configured to have a first voltage range between a third power supply voltage and the first power supply voltage, and the output signal is configured to have a second voltage range between the third power supply voltage and the highest voltage value between the first power supply voltage and the second power supply voltage.

8. A dual supply level shifter circuit comprising:
- a supply switching circuit comprising a first set of coupled transistors, wherein the supply switching circuit is coupled to a first supply source that is configured to provide a first power supply voltage and is coupled to a second supply source that is configured to provide a second power supply voltage; and
- a set of level shifter circuits coupled to the supply switching circuit, wherein the set of level shifter circuits comprises a first level shifter circuit and a second level shifter coupled to receive output signals of the first level shifter circuit, wherein the set of level shifter circuits comprises a second set of coupled transistors,
- wherein the supply switching circuit is configured to select the first level shifter circuit to supply to an output node of the dual supply level shifter circuit an output signal having a value of the first power supply voltage when the first power supply voltage is greater than the second power supply voltage, and the supply switching circuit is configured to select the second level shifter circuit to supply to the output node of the dual supply level shifter circuit an output signal having a value of the second power supply voltage when the second power supply voltage is greater than the first power supply voltage.

9. The dual supply level shifter circuit of claim 8, wherein the first level shifter circuit includes an output node, and the second level shifter circuit includes an output node that is connected to the output node of the dual supply level shifter circuit, wherein the output node of the first level shifter circuit is coupled to the output node of the second level shifter circuit via a first transistor.

10. The dual supply level shifter circuit of claim 9, wherein the first transistor has a gate terminal coupled to the second supply source.

11. The dual supply level shifter circuit of claim 9 further comprising an inverted output node of the output node of the dual supply level shifter circuit, wherein:
- the first level shifter circuit includes an inverted output node of the output node of the first level shifter circuit;
- the second level shifter circuit includes an inverted output node of the output node of the second level shifter circuit;
- the inverted output node of the second level shifter circuit is connected to the inverted output node of the dual supply level shifter circuit;
- the inverted output node of the second level shifter circuit is coupled to the inverted output node of the first level shifter circuit via a second transistor.

12. The dual supply level shifter circuit of claim 8, wherein the supply switching circuit comprises a transistor that couples the second level shifter circuit to the second supply source, wherein the transistor includes a gate terminal coupled to the first supply source.

13. The dual supply level shifter circuit of claim 8, wherein:
the first level shifter circuit comprises:
- a first transistor having a gate terminal coupled to the output node, a first terminal coupled to a first node and to the first supply source, and a second terminal;
- a second transistor having a gate terminal coupled to the second terminal of the first transistor, a first terminal coupled to the first node and to the first supply source, and a second terminal coupled to the output node;
- a third transistor having a gate terminal coupled to the input node, a first terminal coupled to a third supply source, and a second terminal coupled to the second terminal of the first transistor; and
- a fourth transistor having a gate terminal coupled to the first circuit at an inverted input node that is configured to receive an inverse signal of the input signal, a first terminal coupled to the third supply source, and a second terminal coupled to the output node; and the second level shifter circuit comprises:
- a fifth transistor having a gate terminal coupled to the output node, a first terminal coupled to a second node and coupled to the second supply source, and a second terminal;
- a sixth transistor having a gate terminal coupled to second terminal of the fifth transistor, a first terminal coupled to the second node and coupled to the second supply source, and a second terminal coupled to the output node;
- a seventh transistor having a gate terminal coupled to a third node, a first terminal coupled to the third supply source, and a second terminal coupled to the second terminal of the fifth transistor; and an eighth transistor having a gate terminal coupled to a fourth node, a first terminal coupled to the third supply source, and a second terminal coupled to the output node.

14. The dual supply level shifter circuit of claim 13, wherein the third node is coupled to the second terminal of the fourth transistor, and the fourth node is coupled to the second terminal of the third transistor.

15. The dual supply level shifter circuit of claim 13, wherein the third node is coupled to the input node, and the fourth node is coupled to the inverted input node.

16. The dual supply level shifter circuit of claim 13, wherein the supply switching circuit comprises:
   a ninth transistor having a gate terminal coupled to the first supply source, a first terminal coupled to the second supply source and second and third terminals coupled to the second node;
   a tenth transistor having a gate terminal coupled to the second supply source, a first terminal coupled to the first level shifter circuit, and second and third terminals coupled to the second level shifter circuit; and
   an eleventh transistor having a gate terminal coupled to the second supply source, a first terminal coupled to the first level shifter circuit, and second and third terminals coupled to the second level shifter circuit.

17. The dual supply level shifter circuit of claim of claim 16, wherein the first terminal of the tenth transistor is coupled to the second terminal of the first transistor, the second and third terminals of the tenth transistor are coupled to the second terminal of the fifth transistor, the first terminal of the eleventh transistor is coupled to the second terminal of the second transistor, the second and third terminals of the eleventh transistor are coupled to the output node.

18. The dual supply level shifter circuit of claim 16 further comprising:
   a first diode having an anode coupled to the first terminal of the ninth transistor and a cathode coupled to the second and third terminals of the ninth transistor;
   a second diode having an anode coupled to the first terminal of the tenth transistor and a cathode coupled to the second and third terminals of the tenth transistor;
   a third diode having an anode coupled to the first terminal of the eleventh transistor and a cathode coupled to the second and third terminals of the eleventh transistor.

19. A dual supply level shifter circuit comprising:
   a supply switching circuit comprising a first set of coupled transistors that includes a first transistor, wherein the supply switching circuit is coupled to a first supply source that is configured to provide a first power supply voltage and is coupled to a second supply source that is configured to provide a second power supply voltage;
   a set of level shifter circuits comprising a first level shifter circuit coupled to the first supply source and a second level shifter circuit coupled to the second supply source, wherein the set of level shifter circuits comprises a second set of coupled transistors, wherein the set of level shifter circuits is configured, to receive a voltage input signal at an input node from a first circuit and to supply to an output node of the dual supply level shifter circuit an output signal having a value that is a highest voltage value between the first power supply voltage and the second power supply voltage;
   wherein the first level shifter circuit includes an output node, and the second level shifter circuit includes an output node that is connected to the output node of the dual supply level shifter circuit, wherein the output node of the first level shifter circuit is coupled to the output node of the second level shifter circuit via the first transistor.

20. The dual supply level shifter circuit of claim 19, wherein the supply switching circuit further comprises a second transistor that couples the second level shifter circuit to the second supply source, wherein the second transistor includes a gate terminal that is connected to the first supply source.

* * * * *